United States Patent
Whitcombe et al.

(10) Patent No.: US 12,362,759 B2
(45) Date of Patent: Jul. 15, 2025

(54) TIME-DOMAIN ASSIST FOR SUCCESSIVE APPROXIMATION ADC

(71) Applicant: Intel Corporation, Santa Clara, CA (US)

(72) Inventors: Amy Whitcombe, Saratoga, CA (US);
Asma Beevi Kuriparambil Thekkumpate, Santa Clara, CA (US);
Brent R. Carlton, Portland, OR (US);
Chun Lee, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 646 days.

(21) Appl. No.: 17/667,786

(22) Filed: Feb. 9, 2022

(65) Prior Publication Data
US 2023/0253976 A1    Aug. 10, 2023

(51) Int. Cl.
*H03M 1/38*    (2006.01)
*G04F 10/00*    (2006.01)
*H03M 1/10*    (2006.01)

(52) U.S. Cl.
CPC ........ *H03M 1/1023* (2013.01); *G04F 10/005* (2013.01)

(58) Field of Classification Search
CPC ......... H03M 1/1023; H03M 1/50; H03M 1/38
USPC ................................ 341/155, 144, 161, 163
See application file for complete search history.

(56) References Cited

U.S. PATENT DOCUMENTS

| | | | | |
|---|---|---|---|---|
| 9,973,178 B1* | 5/2018 | Holzmann | .......... | H03K 5/00006 |
| 2013/0057424 A1* | 3/2013 | Jeon | ....................... | H03M 1/462 |
| | | | | 341/158 |
| 2023/0387934 A1* | 11/2023 | Zhao | ....................... | H03M 1/14 |
| 2025/0030433 A1* | 1/2025 | Chen | ....................... | H03M 1/38 |

OTHER PUBLICATIONS

Kim, J, "A Hybrid-Domain Two-Step Time-to-Digital Converter Using a Switch-Based Time-to-Voltage Converter and SAR ADC", IEEE Transactions on Circuits and Systems II, vol. 62, No. 7, (Jul. 7, 2015), pp. 631-635.

Kull, L, "Implementation of Low-Power 6-8b 30-90 GS s Time-Interleaved ADCs with Optimized Input Bandwidth in 32nm CMOS", IEEE Journal of Solid-State Circuits, vol. 51, No. 3, (Mar. 3, 2016), pp. 636-648.

Lyu, Y, "A 4 GS s 39.9 dB SNDR 11.7 mW Hybrid Voltage-Time Two-Step ADC with Feedforward Ring Oscillator-Based TDCs", IEEE Journal of Solid-State Circuits vol. 55, No. 7, (Jul. 7, 2020), pp. 1807-1818.

(Continued)

*Primary Examiner* — Peguy Jean Pierre
(74) *Attorney, Agent, or Firm* — Schwegman Lundberg & Woessner, P.A.

(57) ABSTRACT

An apparatus, system, and method for are provided. A device includes a time-to-digital converter (TDC) situated to convert a time-domain signal to a digital value, a delay circuit situated in parallel with the TDC and to delay the time-domain signal by a specified amount of time resulting in a delayed time-domain signal, a time-to-voltage converter (TVC) situated to produce a voltage-domain signal based on the delayed time-domain signal, and a successive approximation (SAR) circuit situated to receive the digital value and the voltage-domain signal and produce a digital-domain version of the input signal.

20 Claims, 13 Drawing Sheets

(56) References Cited

OTHER PUBLICATIONS

Malki, B, "A 70 dB DR 10b 0-to-80 MS s Current-Integrating SAR ADC with Adaptive Dynamic Range", IEEE Journal of Solid-State Circuits, vol. 49, No. 5, (May 2014), pp. 1173-1183.

Murmann, B, "ADC Performance Survey 1997-2021", (ISSCC and VLSI Symposium) [Online]. Retrieved from the Internet: URL: http: web.stanford.edu ~murmann adcsurvey.html., (2021), 5 pgs.

Ravi, A, "A 9.2-12 GHz, 90nm digital fractional-N synthesizer with stochastic TDC calibration and -35 -41 dBc integrated phase noise in the 5 2.5 GHz bands", IEEE Symposium on VLSI Circuits, (Jun. 2010), pp. 143-144.

Sung, B, "A 21 fJ conv-step 9 ENOB 1.6 GS s 2x Time-Interleaved FATI SAR ADC with Background Offset and Timing-Skew Calibration in 45nm CMOS", ISSCC Digest of Technical Papers, (Feb. 2015), 3 pgs.

Vaz, Bruno, "A 13b 4 GS s Digitally Assisted Dynamic 3-Stage Asynchronous Pipelined-SAR ADC", 2017 IEEE International Solid-State Circuits Conference (ISSCC), (2017), 3 pgs.

Zhu, S, "A 0.073-mm2 10 GS s 6-bit Time-Domain Folding ADC in 65-nm CMOS with Inherent DEM", IEEE Custom Integrated Circuits Conference, (Sep. 2015), 4 pgs.

\* cited by examiner

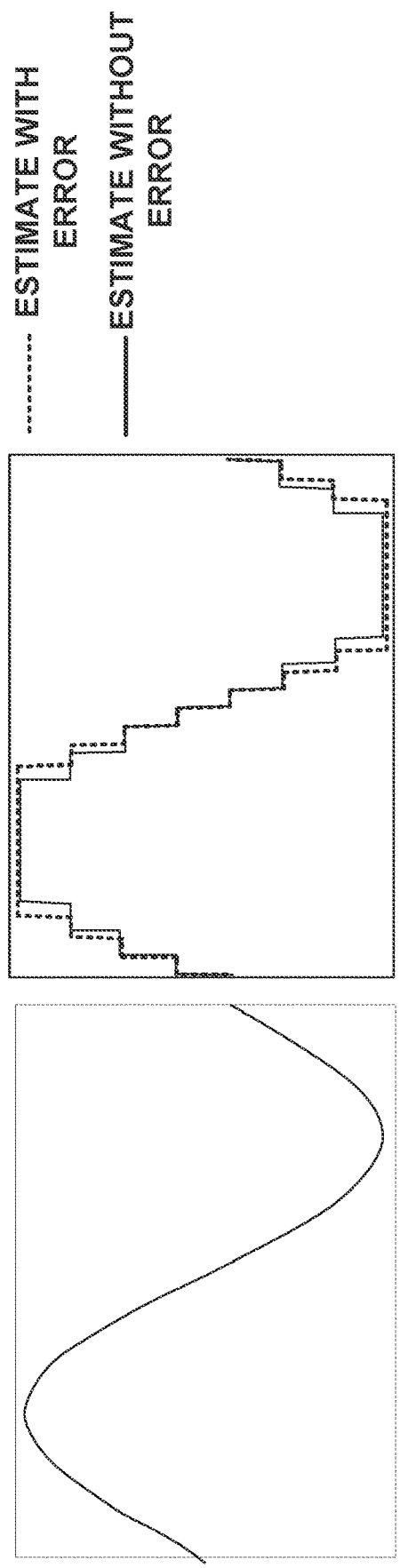
FIG. 3
FIG. 4
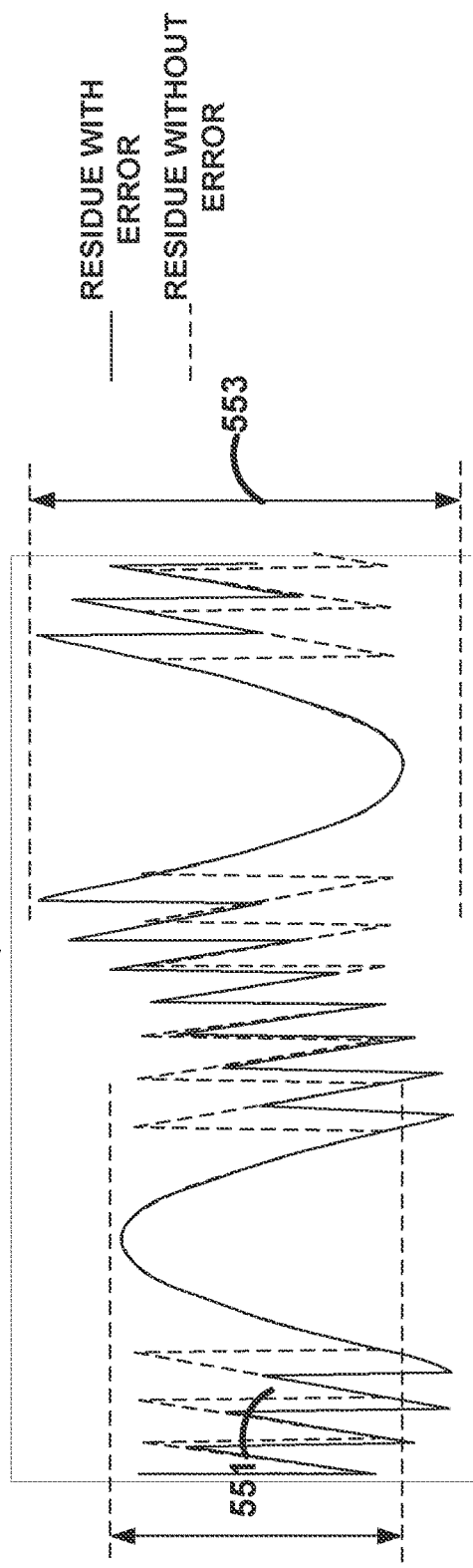
FIG. 5

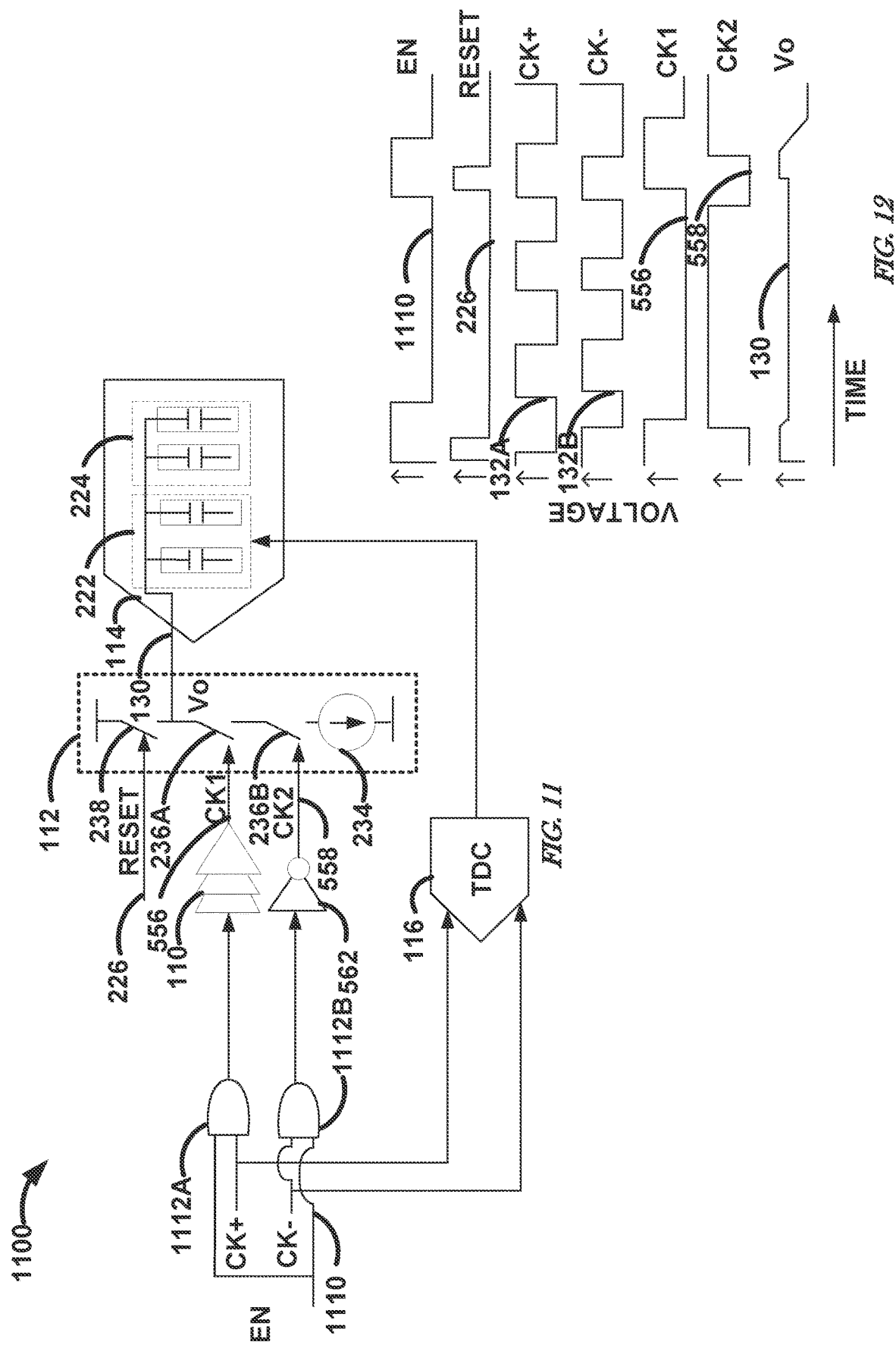

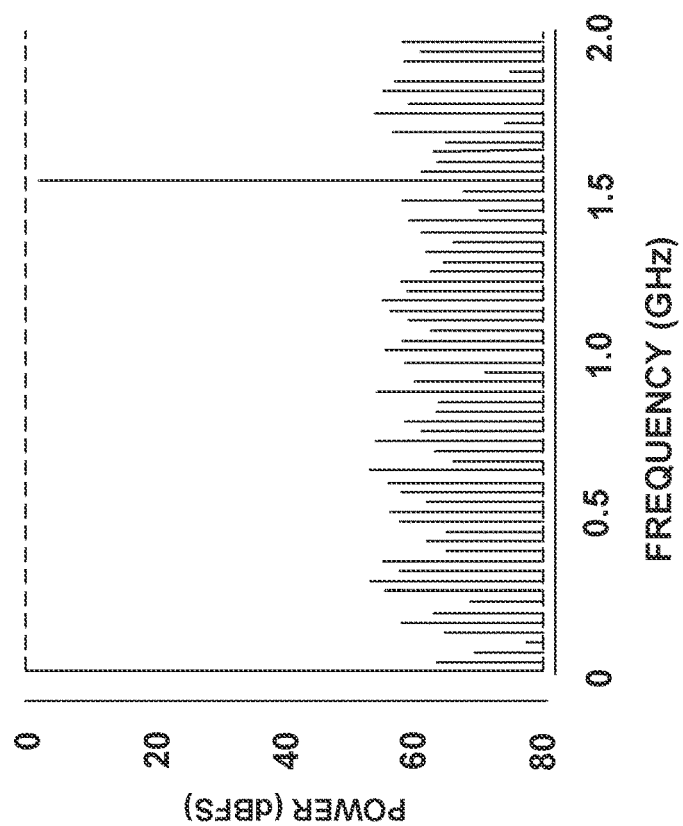
FIG. 15
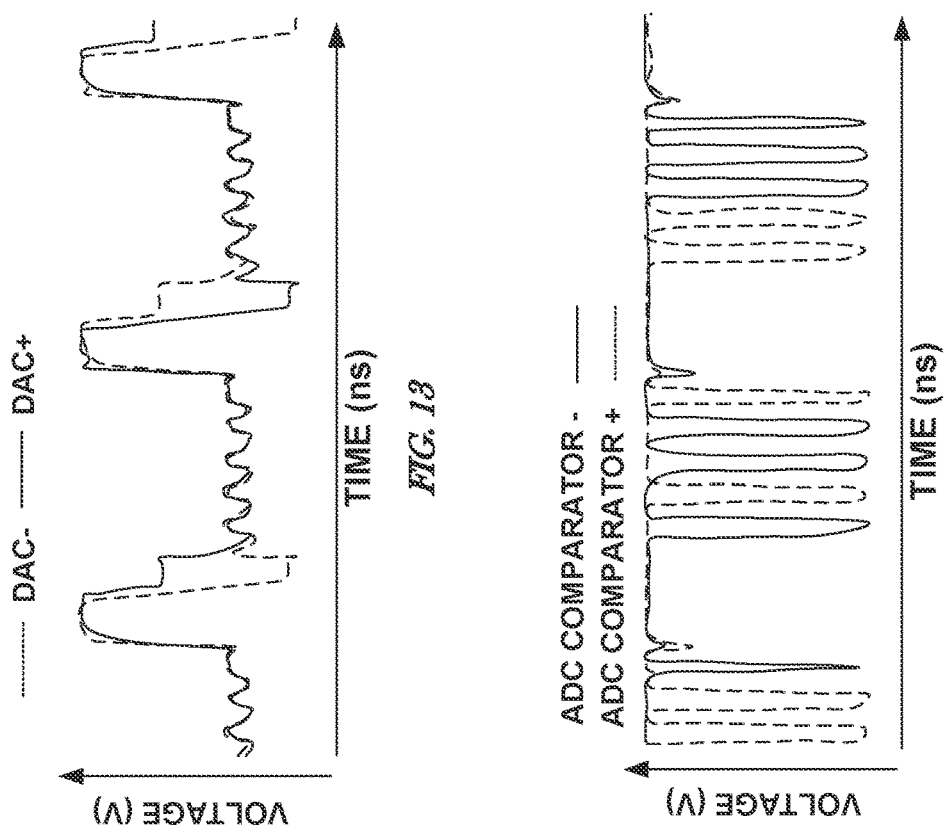
FIG. 13
FIG. 14

TIME-DOMAIN ASSIST FOR SUCCESSIVE APPROXIMATION ADC

TECHNICAL FIELD

Embodiments pertain to analog to digital converter (ADC) improvements. Some embodiments relate to ADC architectures that provide fast sampling rates greater than 10 giga-samples (GS) per second (s).

BACKGROUND

High-speed (>10 (=GS/s) data converters are a key component of many high-bandwidth communication systems such as >100 giga-bit (Gb) per second wireline links. In a single sample period, for a conventional N-bit successive approximation (SAR) ADC, a converter samples an input, performs N comparator decisions and feedback cycles, and resets a digital to analog converter (DAC) voltage in preparation for the next sample. Speed can be increased at the expense of efficiency by consuming more power to reduce the feedback loop delay.

Pipelining improves speed by splitting the conversion into multiple stages, with a gain stage to amplify the error residue. This reduces the number of feedback cycles per stage in the ADC sample period but also requires an accurate inter-stage gain estimate to reconstruct the signal. When power, voltage, and temperature (PVT)-sensitive open-loop dynamic residue amplifiers are used to improve energy efficiency, gain is unpredictable, and calibration is performed. This calibration requirement also applies to hybrid pipelined time-domain and voltage-domain analog to digital converters (ADCs) that combine voltage domain SAR ADCs and time to digital converters (TDCs).

An alternative method for improving ADC speed that does not require inter-stage gain estimation is to use a coarse high-speed assist ADC to generate an initial estimate of the input signal. Flash-assisted SAP. ADCs use a high-speed quantizer (typically a flash ADC) to coarsely approximate the ADC input prior to SAR operation, reducing the number of decision cycles in the SAR ADC. The assist quantizer is fast enough to ensure the coarse estimate bits are ready by the time the SAR sampling is complete so the bits can be applied immediately to the feedback DAC to allow sufficient settling time for the first SAR comparison. Gain estimation is not needed for signal reconstruction because the same feedback DAC is used for both the M-bit coarse feedback and the K-bit residue ADC.

A drawback of flash ADCs typically used as an assist quantizer is inherent power inefficiency. An N-bit SAR ADC requires only N sequential comparator decisions, while a flash ADC requires $2^N$ comparisons, causing power to grow exponentially instead of linearly with the number of bits N.

BRIEF DESCRIPTION OF THE FIGURES

In the figures, which are not necessarily drawn to scale, like numerals may describe similar components in different views. Like numerals having different letter suffixes may represent different instances of similar components. The figures illustrate generally, by way of example, but not by way of limitation, various embodiments discussed in the present document.

FIG. 3 illustrates, by way of example, a graph of voltage versus time for a sine wave input signal.

FIG. 4 illustrates, by way of example, a graph of code versus time for output of the time-to-digital converter (TDC) with error and without error.

FIG. 5 illustrates, by way of example a graph of voltage versus time for residue to be quantized.

FIG. 11 illustrates, by way of example, a diagram of an embodiment of a sub-ADC configured for calibration.

FIG. 12 illustrates, by way of example, respective graphs of voltage versus time for various traces in the sub-ADC.

FIGS. 13, 14, and 15 show, by way of example, graphs of time-domain operation and output spectrum obtained via schematic simulations of the sub-ADC.

DETAILED DESCRIPTION

Figure 1:
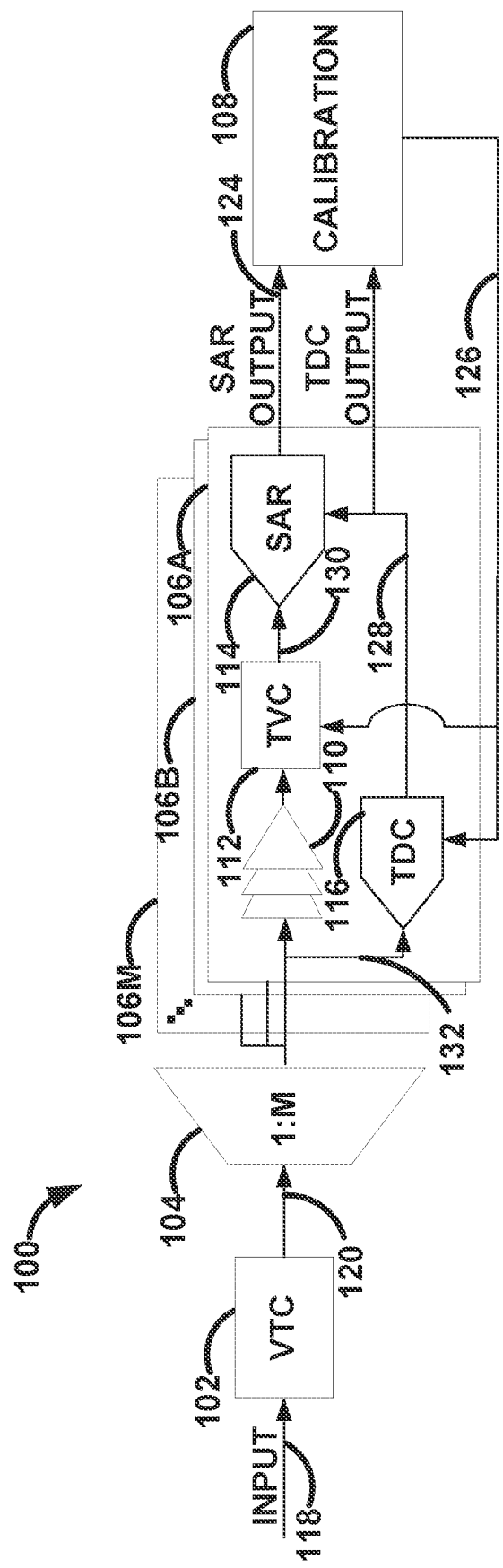
FIG. 1 illustrates, by way of example, a circuit diagram of an embodiment of an analog-to-digital converter (ADC).

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Embodiments use a time-domain sampler which allows an input signal to be delayed relative to the assist quantizer easily with a delay line as described later in the disclosure. This allows the use of a slower, more power-efficient time-to-digital converter (TDC) as the assist quantizer instead of a fast but high-power flash analog to digital converter (ADC).

One challenge in building a high-speed ADC is maintaining energy efficiency. ADCs above 10 GS/s are usually built from parallel time-interleaved sub-ADCs, which are often power-efficient and scaling-friendly successive approximation (SAR) ADCs running <1 GS/s. As ADC area and complexity scales with the number of sub-ADCs, fast sub- ADCs are desired. Boosting SAR ADC speed requires a higher supply and larger devices that reduce energy efficiency. Pipelining or flash assist architectures can improve speed at the expense of complexity and/or power. The proposed design uses a TDC to assist the SAR sub-ADC operation without sacrificing energy efficiency and with fewer calibration requirements than pipelined ADCs.

In high-speed ADCs, it is also difficult to amplify the input signal to utilize the full ADC range. Many high-speed ADCs are driven by unity-gain source follower buffers due to stringent bandwidth and linearity requirements but adding gain to the ADC sampling buffer can help reduce input-referred ADC noise and relax linearity specifications on the ADC driver. The proposed time domain ADC architecture of some embodiments uses a current integrating dynamic amplifier that can easily provide tunable gain.

In addition to data conversion applications, high accuracy TDCs are used for frequency synthesizers where IDC mismatch creates unwanted spurs. The proposed hybrid TDC and SAR architecture can also be used as a means of detecting TDC error to within the resolution of a SAR ADC to enable TDC calibration.

A generic implementation of a time-interleaved ADC is described to provide a description of high-speed ADC sampling. A total of N=MK sub-ADCs are typically sampled in two stages: a first stage of K high-speed samplers, and a second stage buffer driving M sub-ABCs. The sampling is split into stages to reduce the bandwidth-limiting capacitive load at the ADC input for high-speed designs with large N.

The $2^{nd}$ stage is buffered to prevent sub-ADC loading on the input to maintain a high bandwidth to achieve a flat frequency response after interleaving. This buffer is typically implemented with a source follower to achieve the desired bandwidth and linearity. In comparison, current integrating samplers charge/discharge a load with a fixed current after it is reset, which does not burn static power and provides a frequency-independent gain that scales with the output load.

Current integrating samplers have been used in prior ADC work, but mainly for low-speed applications. In <100 megasample per second (MS/s) single-slice ADC applications, such as that described in B. Malki et. al., "A 70 dB DR 10b 0-to-80 MS/s Current-Integrating SAP. ADC with Adaptive Dynamic Range," *IEEE Journal of Solid-Slate Circuits*, vol. 49, no. 5, May 2014, pp. 1173-1183, current integration has been used to provide alias image rejection during sampling. Pipelined SAR ADCs also often use integrating amplifiers to sample a voltage residue onto a second-stage ADC, but this technique has not been commonly applied to time-interleaved SAR ADC sampling.

TDCs are used in many applications such as the hybrid ADC of embodiments, conventional TDCs, and frequency synthesizers. Many of these applications rely on highly linear TDCs, which can require TDC calibration. Certain architectures such as ring oscillator based TDCs can improve measured differential non-linearity (DNL) but suffer higher noise floor due to mismatch and quantization. More complex calibration methods using stochastic techniques and digital histogram calibration have been done but must be performed as a one-time foreground calibration using a reference signal.

The TDC-assisted SAR architecture of embodiments can also be applied to this TDC calibration application, making it useful in frequency synthesizers as well as high-speed ADCs. As discussed below, any discrepancy between the assist quantizer and the coarse feedback digital to analog converter (DAC) will lead to a larger residue that can be directly measured with the final quantizer.

Embodiments, as previously discussed, use time-domain signaling to efficiently boost ADC speed, incorporating a voltage-to-time converter (VTC), optional digital de-multiplexer, coarse time-to-digital converter (TDC), and time-to-voltage converter (TVC) to amplify and sample the signal onto a final SAP, ADC.

FIG. 1 illustrates, by way of example, a circuit diagram of an embodiment of an ADC 100. The ADC 100 as illustrated includes a VTC 102, a demultiplexer 104, M sub-ADCs 106A, 106B, 106M, and calibration circuitry 108. The VTC 102 converts a voltage of an input signal 118 to differential delay pulses 120. The delay in each pulse is proportional to the value of the voltage on the input signal 118. The VTC 102 generates a time-domain signal. The VTC pulses 120 can drive a digital de-multiplexer 104 (e.g., implemented with CMOS logic).

The VTC 102 can include a sampling switch, capacitor, current source, and inverter or buffer (e.g., two inverters) for threshold detection. After sampling, the capacitor can be discharged through the current source, pulling the inverter output high (or buffer output low) once the sampled voltage crosses the inverter threshold. Two single-ended VTC 102 can encode the differential voltage input in the falling edge time difference between CK+ signal 132A and CK− signal 132B (see FIG. 7).

The demultiplexer 104 is a combinational logic circuit that switches an input line to one of M output lines. Each of the output lines of the demultiplexer 104 is electrically coupled to a different sub-ADC 106A, 106B, 106M. An embodiment of the digital de-multiplexer 104 where M=4 can use a divide-by-4 circuit to generate enable signals that split each (e.g., 4 GHz) clock into four (e.g., 1 (1 Hz) clocks that drive the TVC 112 and the TDC 116. In this implementation, the pipelined successive approximation TDC 116 can be constructed from CMOS standard cells and has a latency of <150 picoseconds for 3b operation.

Each sub-ADC 106A, 106B, 106M includes a delay 110 (e.g., a programmable delay), a TVC 112, a TDC 116, and a SAR ADC 114. Output from the VTC 102 or the demultiplexer 104 can be provided to the delay 110 and the TDC 116, The delay 110 can include a number of buffers or inverters with known, or determinable delay. The delay 110 can slow the signal enough to allow the TDC 116 to operate and provide a result. An output of the delay 110 can be used to drive switches of the TVC 112 and comparators of the TDC 116.

The TDC 116 can convert the delay difference between the two pulses from the VTC 102 to a digital estimate of this delay difference. The signal to be measured by the TDC 116 generally starts when a rising or falling edge of a first pulse crosses a set threshold voltage and stops when a rising or falling edge of a corresponding next pulse crosses the set threshold voltage.

The TVC 112 converts the pulses from the VTC 102 to a corresponding voltage representation. The TVC 112 typically operates using a current source to charge a capacitor for the time between pulses and the voltage across the capacitor corresponds to the time between pulses.

The SAR 114 can include a comparator, digital feedback logic, and capacitive DAC driven by the TVC 112 for input sampling. The SAR 114 operates by subtracting TDC output 128 from TVC output 130 by applying output 128 to the MSBs of the SAR 114 capacitive DAC. The TDC 116 can have fewer bits than the SAR 114. The most significant bits (MSBs) of a feedback DAC in the SAR 114 can be connected (possibly through complementary metal oxide semiconductor (CMOS) gates) to the output of the TDC and the remaining bits of the feedback DAC can be connected to (e.g., only) the feedback logic and comparator in the SAR 114. Redundancy can be achieved by causing a total sum of weights of the DAC driven by the SAR 114 feedback logic to be greater than the smallest DAC weight driven by the TDC 116.

The VTC 102 and current integrating TVC 112 may provide signal gain and the input to TVC 112 may be delayed using buffers 110 to compensate the assist TDC 116 latency. The TDC 116 estimate is subtracted from the input signal within the SAR 114 after TVC 112 sampling. The TDC 116, TVC 112, and SAR 114 components of the ADC 100 (portions of which may be merged for power savings) may be used to calibrate TDC 116 mismatch or TVC 112 gain error by comparing the TDC 116 and SAR 114 ADC bits, which could be applied not just to ADCs but other applications such as frequency synthesizers.

The calibration circuitry 108 can adjust a gain of the TVC 112 using a calibration signal 126. The calibration signal 126 can adjust the gain based on a variance of a residue (difference between SAR 114 input and TDC 116 output applied to MSBs of DAC of SAR 114, measured by the LSBs of SAR 114). More details regarding the calibration are provided elsewhere.

Figure 2:
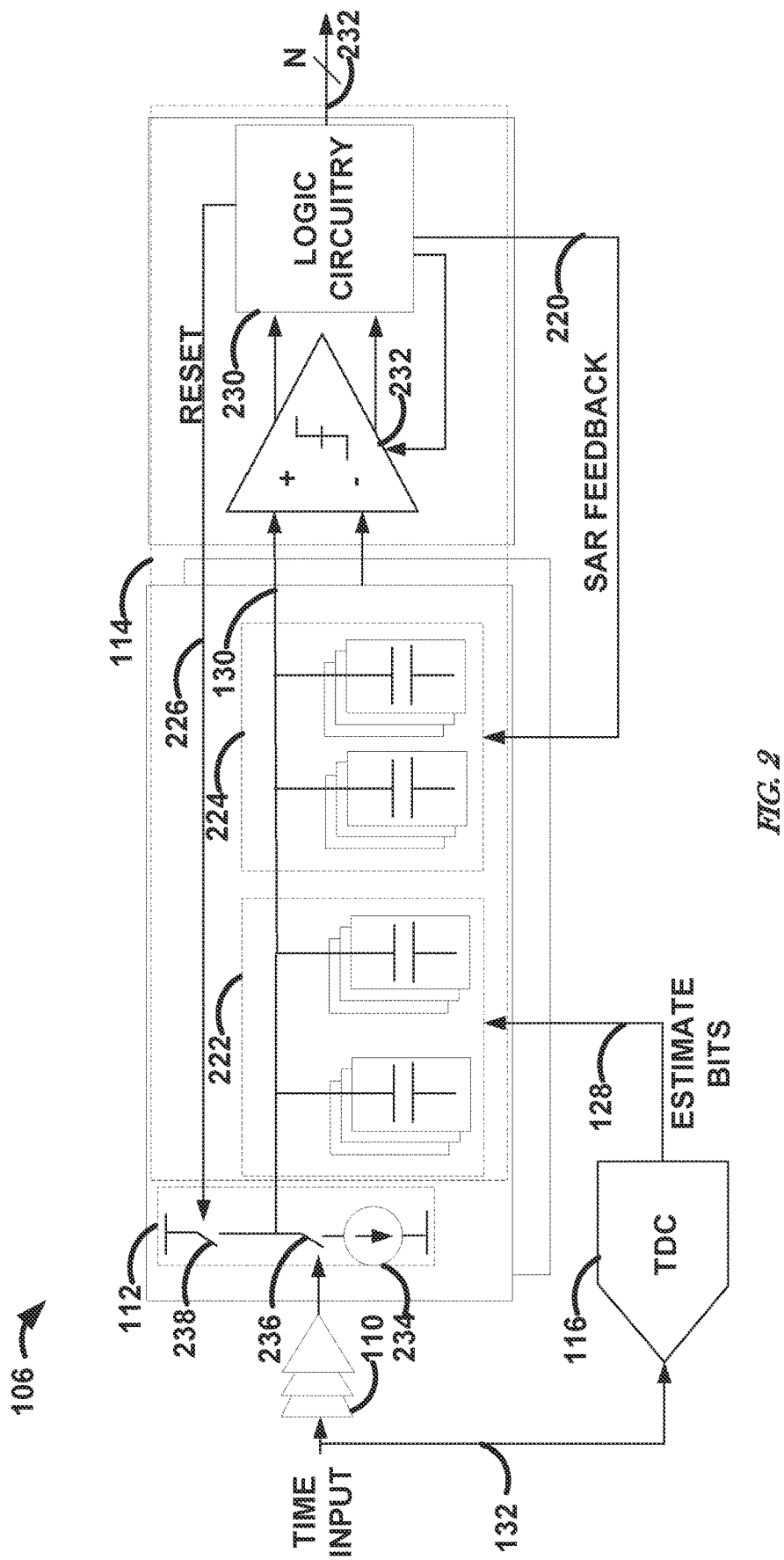
FIG. 2 illustrates, by way of example, a more detailed diagram of an embodiment of the sub-ADC.

FIG. 2 illustrates, by way of example, a more detailed diagram of an embodiment of the sub-ADC 106 with further details of the SAR 114 implementation, Note that a reference number with an alphabetic suffix is a specific instance of a component that may be represented generally by a reference number without an alphabetic suffix. Thus, the sub-ADC 106 represents the specific instances of the sub-ADC 106A, 106B, 106M and each of the sub-ADCs 106A, 106B, 106M can include the architecture of the general sub-ADC 106.

The sub-ADC 106 includes the delay 110, the TVC 112, the TDC 116, and the SAR 114. The TVC 112 enables current integrating signal amplification. The TDC 116 can be coarse to boost the SAR 114 and sub-ADC 106 speed. Coarse means that the TDC 116 produces fewer bits than the full sub-ADC (e.g., if the overall sub-ADC is N bits, the TDC 116 produces less than N bits). If the full sub-ADC has N hits, the TDC 116 has M bits and the additional SAR feedback to quantize the residue is K bits, M+L<=N and M and K are >0. The VTC 102 (see FIG. 1) translates the input voltage into a delay between clock edges. The maximum VTC 102 speed may be faster than the SAR 114 ADC rate. The digital de-multiplexer 104 (see FIG. 1) can be used to separate the high-speed VTC 102 output 120 into slower signals 132 that can run at the SAR 114 ADC rate. This is preferable to using multiple VTCs 102 because sharing a sampler and VTC 102 eliminates timing skew or bandwidth mismatch calibration, and the VTC sampling capacitance can be small to support high bandwidths. In the proposed design, the SAR 114 sub-ADC 106 sampling can be implemented via current integration in the TVC 112. In parallel with the TVC 112, the assist TDC 116 estimates the MSBs to reduce the number of SAR feedback 220 cycles.

The SAR 114 as illustrated includes a capacitive DAC comprising capacitor banks 222, 224, comparator 232, and digital feedback logic circuitry 230 driven by a TVC 112 for sampling the input voltage onto capacitor banks 222, 224. This TVC 112 includes a current source 234, an enable switch 236, and a reset switch 238 to drive the SAR 114 capacitor banks 222, 224. The time-domain input 132 to the TVC 112 (the signal driving the control switch 236 after delay 110) is also fed to the TDC 116. The TDC 116 has fewer bits than the total ADC output 232 resolution. The MSB array 222 of the feedback DAC in the SAR 114 can be connected (possibly through CMOS logic gates) to the output 128 of the TDC 116, and the remaining bits 224 of the feedback DAC are connected to the comparator 232 via the logic circuitry 230 in the SAR 114, The MSBs of the DAC are the bottom plate voltages of capacitors in the capacitor bank 222 and the LSBs of the DAC are the bottom plate voltages of the capacitors in the capacitor bank 224. Redundancy can be implemented in the DAC, meaning a total sum of DAC weights in the capacitor bank 224 is greater than the smallest DAC weight in the capacitor bank 222.

Redundancy in the SAR 114 DAC may be used to correct error in the TDC 116. For example, one possible source of error is range misalignment between the TDC 116 and the SAR 114.

FIG. 3 illustrates, by way of example, a graph of voltage versus time for a sine wave input signal. The input signal can be converted to the time-domain input 132 by the VTC 102.

FIG. 4 illustrates, by way of example, a graph of digital code versus time in response to the sine wave input of FIG. 3 for output 128 of the TDC 116 with gain error and without gain error. The output 128 with error has higher gain than the output without error.

FIG. 5 illustrates, by way of example a graph of voltage versus time for the residue quantized by the LSB SAR array 224 in response to the inputs of FIG. 3 and FIG. 4. An arrow 551 indicates residue range without gain error in FIG. 4 and another arrow 553 indicates residue range with gain error in FIG. 4. The corresponding residue covers a larger range when the error is present requiring more resolution in the LSBs provided by the capacitor bank 224. Redundancy in the feedback DAC weights can provide this additional resolution. Redundancy means that the sum of the LSB bank 224 bit weights used to quantize the residue is greater than the LSB of bank 222. It also means that if the TDC 116 resolution is M bits and the SAR residue quantizer has K feedback cycles, the sum M+K will be greater than the total effective resolution of the sub-ADC.

Voltage-domain signal processing does not easily afford delays, so conventional voltage sampling ADCs require low-latency but power inefficient flash ADCs for assist converters. In the time domain, however, the conversion time of the assist ADC can be easily compensated using a chain of buffers (the delay 110) to delay the input signal, allowing a slower but more energy efficient assist TDC 116 to be used for an assist converter.

Figures 6, 7:
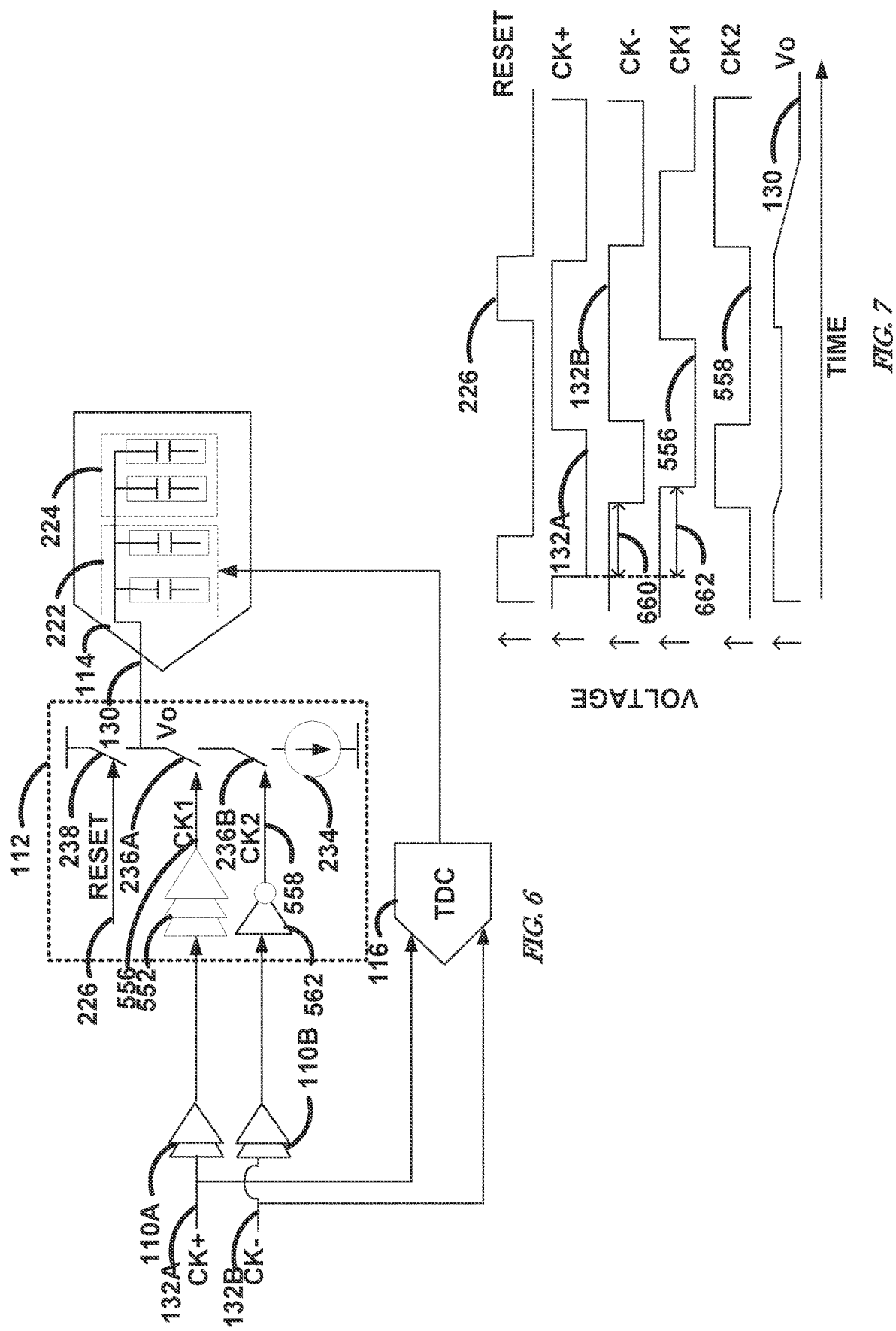
FIG. 6 illustrates, by way of example, a more detailed circuit diagram of the sub-ADC.
FIG. 7 illustrates, by way of example, respective graphs of voltage versus time for various traces in the architecture.

FIG. 6 illustrates, by way of example, a more detailed circuit diagram of the sub-ADC 106 with further details of the TVC 112 implementation. In FIG. 6 a differential input 132A, 132B is provided by the VTC 102 (see FIG. 1). The TVC 112 resets the DAC capacitor bank 224/222 of the SAR 114 to a high operating voltage (VDD). Note that a complementary operation is possible in which the output voltage 130 can be reset to a low operating voltage (VSS) and then charged to higher voltage with the current source 234. The TVC 112 discharges the capacitor bank 224/222 with current $I_{amp}$ (the current of the current source 234) for a time set by the falling edge delay difference $\Delta t_{in}$ 660 (see FIG. 7) of two input clocks, CK+132A and CK−132B. One clock is inverted, by inverter 562, generating signal 558 and the other is delayed, by delay 552, an amount of time corresponding to the peak time-domain signal swing $\Delta t_{max}$ 662 (FIG. 7) to generate a delayed signal 556, If $\Delta t_{max} < \Delta t_{TDC}$ (the delay of the TDC 116), delay 110A, 110B of at least $\Delta t_{TDC} - \Delta t_{max}$ may be applied to both clocks 132A, 132B. The output voltage 130 is $V_{DD} - I_{amp} * (\Delta t_{in} + \Delta t_{max})/C_{DAC}$, where $C_{DAC}$ is the total SAR DAC capacitance (the sum of capacitor banks 222 and 224). This configuration allows a gain from the input delay 660 to output voltage 130 to be programmed through $I_{amp}$.

FIG. 7 illustrates, by way of example, respective graphs of voltage versus time for various traces in the ADC 100. Provided in FIG. 7 is the reset signal 226, CK+132A, CK−132B, CK1 556, CK2 558, and $V_O$ 130. The falling edge time delay 660 is $\Delta t_{in}$ generated from the input voltage via the VTC 102, and the delay 662 is $\Delta t_{max}$ implemented with delay line 552. The graphs in FIG. 7 help aid the understanding of the operations of the ADC 100.

The TVC input delay 110 and $\Delta t_{max}$ delay within the TVC 112 may be merged with a flash-based assist TDC 116 using a common delay line to save power. An embodiment with a merged TVC and TDC that share a delay is shown in FIG. 8.

Figure 8:
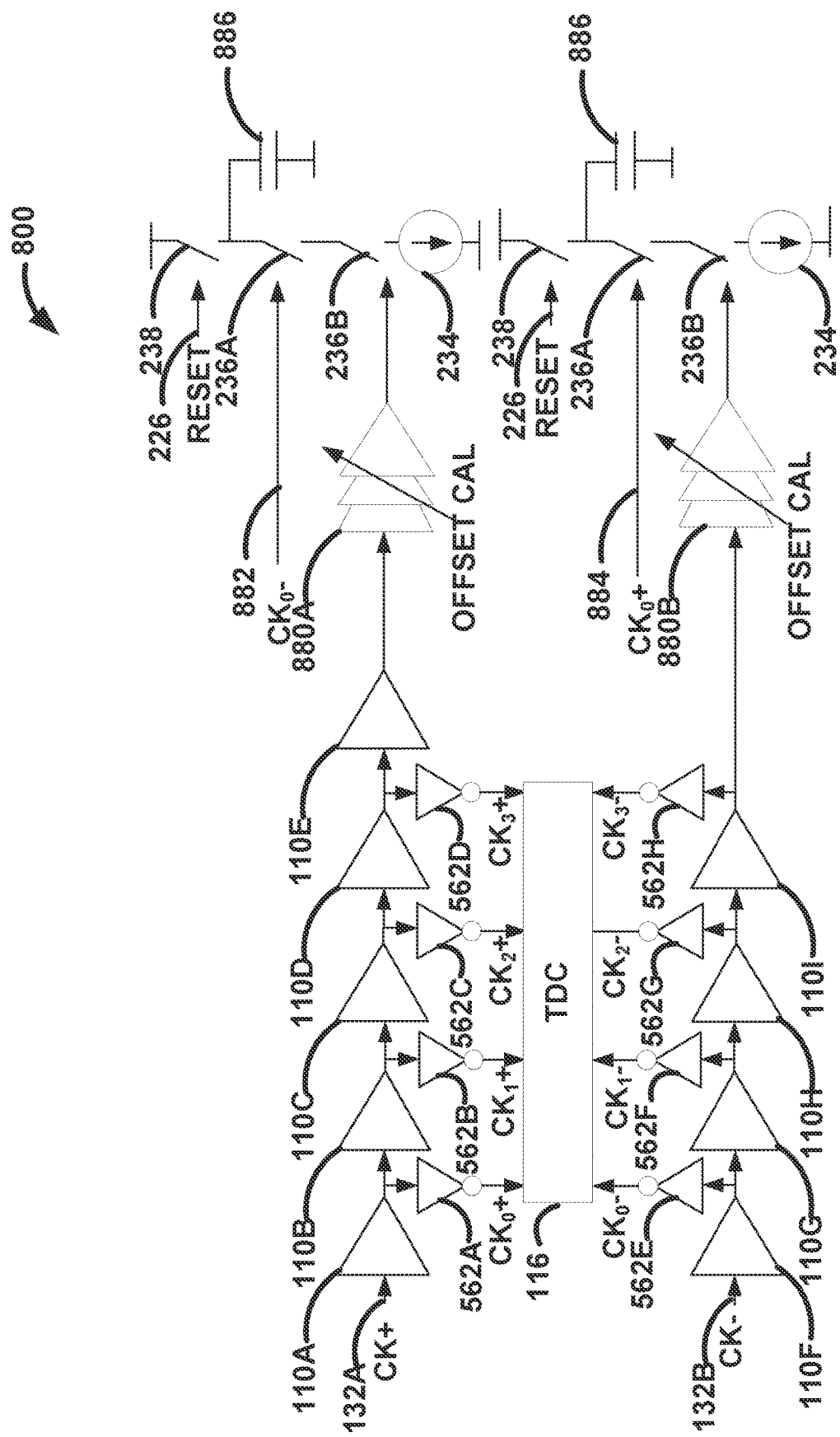
FIG. 8 illustrates, by way of example, a diagram of an embodiment of a combination time-to-voltage converter (TVC) and TDC with a shared delay line.

FIG. 8 illustrates, by way of example, a diagram of an embodiment of a combination circuit 800 that includes the TVC and the TDC with a shared delay line 110, shown as specific instances of delay 110A, 110B, 110C, 110D, 110E, 110F, 110H, 110I. The TDC 116 can be provided with inverted version of individual bits of the CK+ signal 132A and CK− signal 132B. Inverters 562A, 562B, 562C, 562D, 562E, 562F, 562G, 562H invert the signal to produce inverted versions of the bits. A tunable delay 880A, 880B shown at the output of the delay line 110 is optional. The delay 880A, 880B can be used to calibrate for offset and any additional delay required to compensate for TDC conversion. A capacitor 886 represents the SAR 114 DAC that includes capacitor banks 222 and 224. In addition to power savings, merging the delay 110 into the TVC and TDC aligns the TDC range to $\Delta t_{max}$, which helps ensure the signal range is fully utilized. The signal 882 represents an inverted and possibly delayed version of CK− signal 132B, which may be generated from the output of inverter 562E. The signal 884 represents an inverted and possibly delayed version of CK+ signal 132A, which may be generated from the output of inverter 562A.

Figure 9:
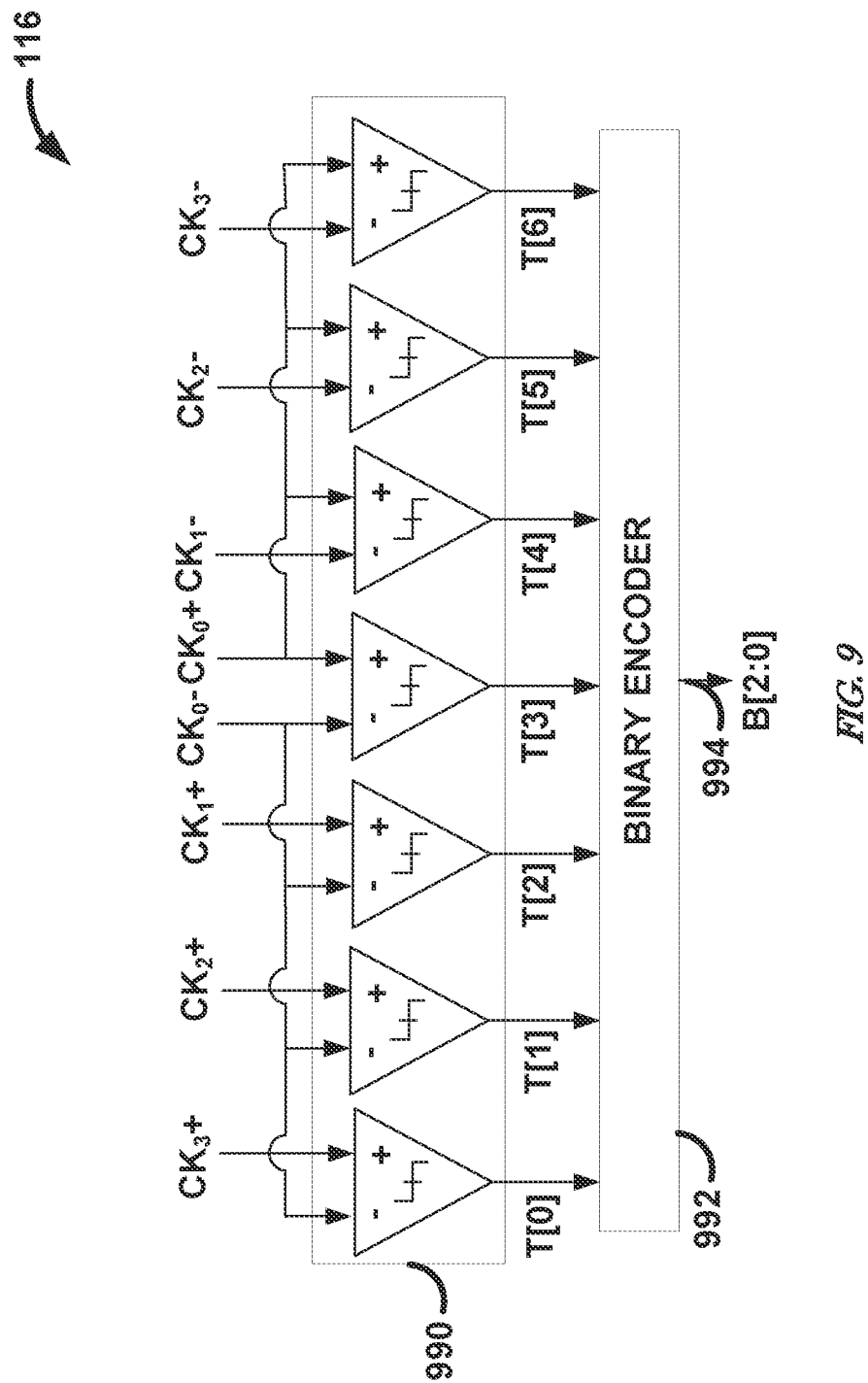
FIG. 9 illustrates, by way of example, a diagram of an embodiment of the TDC.

FIG. 9 illustrates, by way of example, a diagram of an embodiment of the TDC 116, The TDC 116 as illustrated includes a comparator bank 990 that receives CK+ and CK− bits. The comparator bank 990 as illustrated includes seven comparators receiving differential inputs shown in FIG. 8. The comparator bank outputs are converted, by a binary encoder 992, to a three-bit output 994. Note that, in the example of FIG. 9, eight inputs are converted to 3 binary digits. The binary encoder 992 can be a thermometer to binary encoder or other type of encoder.

The SAR 114 output 220 (see FIG. 2) may be used to correct errors in the TDC 116, including SAR 114 and TDC 116 gain alignment errors and TDC 116 nonlinearity. Within the SAR 114, the MSBs 128 of the feedback DAC (MSBs of DAC are implemented using capacitor bank 222) estimated by the TDC 116 are subtracted from the sampled voltage $\Delta V_{in}$, and the resulting residue is converted, by the LSBs 220 of the feedback DAC (LSBs of DAC are implemented using capacitor bank 224) using the SAR 114. Consider an example 3-bit TDC and 5-bit SAR outputs, with [64 32 16 16 8 4 2 1] weights in the SAR 114 DAC for redundancy (weights [64 32 16] for the MSB array 222 and [16 8 4 2 1] for the LSB array 224). Redundancy ensures that the combined output is accurate with only coarse calibration needed to align the TDC 116 and SAR 114 range (e.g., with the TVC 112). However, the SAR 114 residue magnitude can also be used to quantify how well the TDC 116 matches the DAC in the SAR 114, Because the SAR 114 DAC 222 may be constructed from a well-matched capacitor array, this can be used to calibrate the TDC 116. If the TDC 116 is missing codes or nonlinear, the SAR 114 residue measured by the LSB feedback 220 will be larger.

Figure 10:
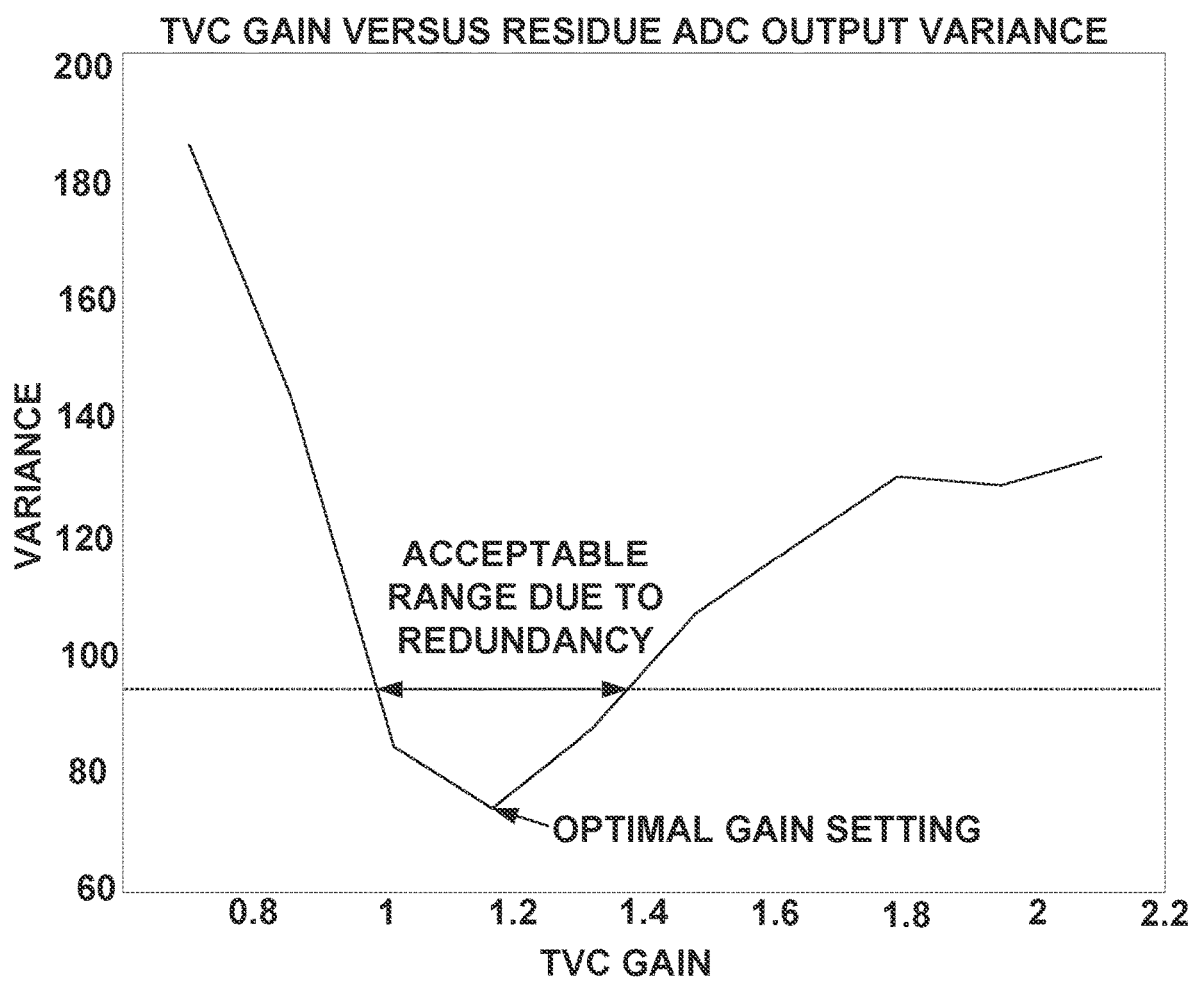
FIG. 10 illustrates, by way of example, a graph of TVC gain versus ADC residue output variance.

FIG. 10 illustrates, by way of example, a graph of TVC gain versus SAR residue digital code 220 output variance. An optimal TVC gain, which corresponds to the optimal TDC 116/SAR 114 range alignment, occurs when the residue variance is minimized. Any minimization technique (e.g., least mean squares or another technique) applied to the SAR 114 residue variance can be used to drive calibration for the TDC 116/SAR 114 gain alignment This approach can be extended to TDC 116 calibration, where the optimal TDC 116 configuration will provide the minimum residue magnitude. To be applied specifically for TDC calibration, the circuit structure may be modified as shown in FIG. 11.

FIG. 11 illustrates, by way of example, a diagram of an embodiment of a TDC 1100 configured for calibration. If the SAR 114 component is used for calibration of TDC 116, SAR samples may be taken less frequently (e.g., every $3^{rd}$ sample in FIG. 12) or only activated during an initial calibration period to save power. This circuit could appear in any application a TDC 116 is used, without the VTC 102 and de-multiplexer 104 shown in FIG. 1. The switch 236 includes a first switch 236A for clock signal CK1 556 and a second switch 236B for clock signal CK2 558.

FIG. 12 illustrates, by way of example, respective graphs of voltage versus time for various traces in the sub-ADC 1100, Provided in FIG. 12 is the reset signal 226, CK+ 132A, CK− 132B, CK1 556, CK2 558, $V_O$ 130, and an enable (EN) signal 1110. The graphs in FIG. 12 help aid the understanding of the operations of the sub-ADC 1100 and how the sub-ADC 1100 can be used for intermittent, periodic, or one-time calibration. The CK+ signal 132A and CK− signal 132B are provided to the delay 110 and inverter 562 respectively when AND gates 1112A, 1112B receive both the enable signal 1110 and CK+ signal 132A and CK− signal 132B asserted simultaneously. This triggers generation of $V_o$ 130. Enable signal 1110 is asserted every third sample of CK+/CK− to reduce the DX 112 and SAR 114 operating frequency relative to TDC 116.

FIGS. 13, 14, and 15 show, by way of example, graphs of time-domain operation and output spectrum obtained via schematic simulations of the sub-ADC. The transient simulation of FIG. 13 shows the SAR DAC voltage 130 vs. time and FIG. 14 shows the corresponding SAR 114 comparator 232 output vs. time. In. 13, after TVC 112 sampling the TDC 116 output bits are applied to SAR 114 MSB DAC bank 222, and then SAR 114 comparator performs 5 decisions using LSB DAC bank 224 to complete the conversion. The comparator outputs are shown in FIG. 14. The FFT of FIG. 15 shows >50 decibel (dB) spurious-free dynamic range (SFDR) with no notable harmonic tones for a very high-frequency (e.g., 22.4 GHz) input sampled at 4 GS/s.

With transient noise enabled, simulations of the 7b ADC (8 physical bits+1b redundancy in the DAC weights) and sampler achieve 6.6 effective number of bits (SNOB) at low frequencies, which drops to 6.18b with a 22 GHz input signal. At 2.2 GHz, the input is attenuated by 1.8 dB due to the bandwidth limitations of a source follower buffer driving the ADC. The expected power consumption of the 4 GS/s buffer driving four 1 GS/s sub-ADCs is 5.3 milli-Watts, leading to an estimated state-of-the-art power efficiency of 18 femto-Joules (fJ)/step for an input signal well above Nyquist).

Figure 16:
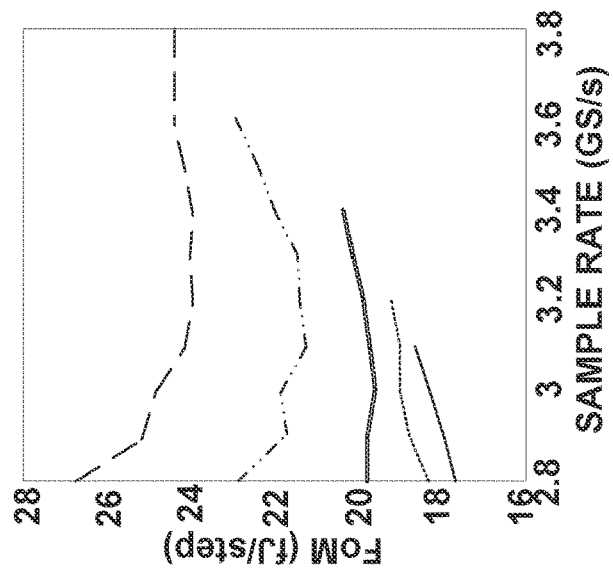
FIG. 16 illustrates, by way of example, a graph of sample rate versus SNDR for various operating voltages of the ADC of embodiments.
Figure 17:
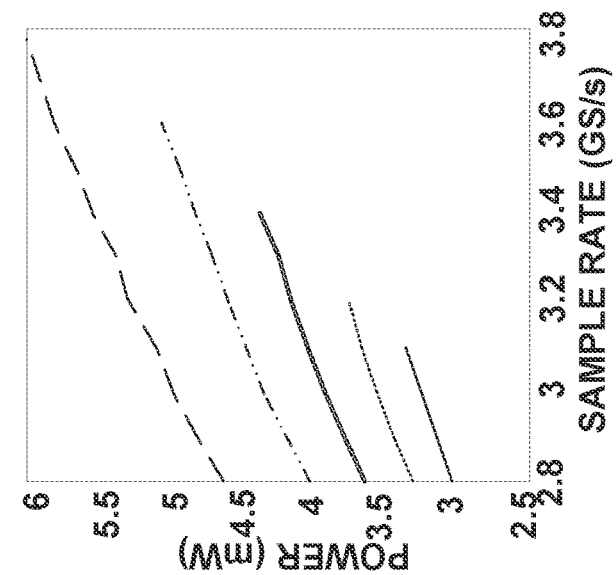
FIG. 17 illustrates, by way of example, a graph of sample rate versus power for various operating voltages of the ADC of embodiments.
Figure 18:
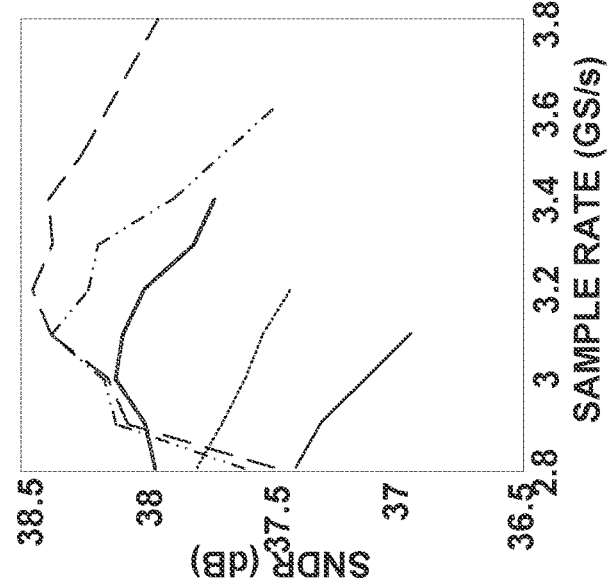
FIG. 18 illustrates, by way of example, a graph of sample rate versus figure of merit (FoM) for various operating voltages of the ADC of embodiments.

FIG. 16 illustrates, by way of example, a graph of measured sample rate versus SNDR for various operating voltages of the ADC of embodiments with a 1.9 GHz full-scale input tone. FIG. 17 illustrates, by way of example, a graph of sample rate versus power consumption for various operating voltages of the ADC of embodiments. FIG. 18 illustrates, by way of example, a graph of sample rate versus figure of merit (FoM) for various operating voltages of the ADC of embodiments. The ADC of embodiments was implemented in silicon and tested. Results of the tests are provided in FIGS. 16-18. Parasitics reduce the peak speed and lead to a maximum resolution of 6.1 ENOB instead of the schematic-simulated 6.6 ENOB, but the design still maintains state-of-the-art energy efficiency of <25 fEstep up to 3.8 GS/s.

Figure 19:
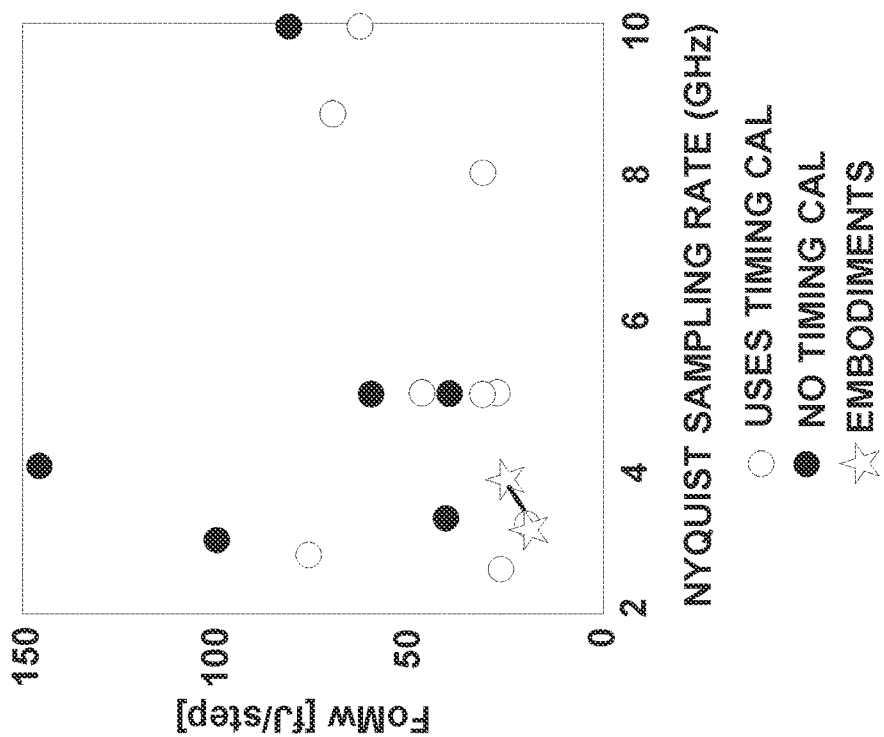
FIG. 19 illustrates, by way of example, a graph of Nyquist sampling rate versus FoM for a variety of ADCs.

FIG. 19 illustrates, by way of example, a graph of Nyquist sampling rate versus FoM for a variety of ADCs. The graph of FIG. 19 compares the measured. ADC FoM to all greater than 2 GS/s ADC designs currently reported in the International Solid-State Circuits Conference (ISSCC) and the Symposium on Very Large Scale Integration (VLSI) Circuits. Because the single VTC 102 enables high speed, the design achieves the best FoM among published works for converters that do not require timing skew calibration.

Figure 20:
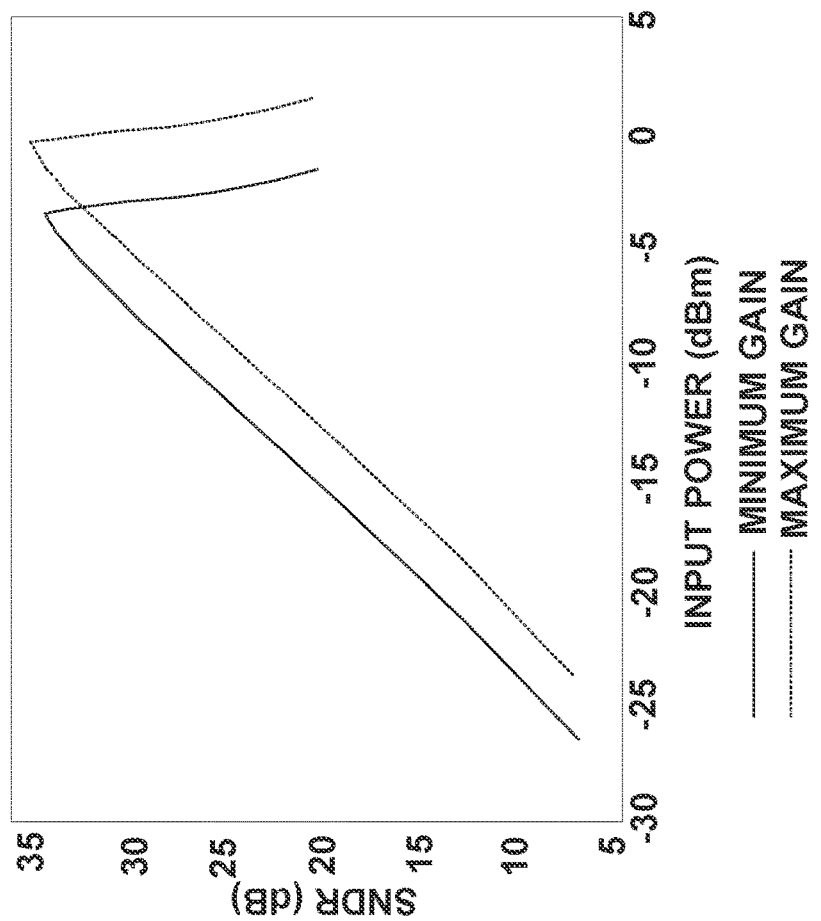
FIG. 20 illustrates, by way of example, a graph of input power versus SNDR for the ADC of embodiments.

FIG. 20 illustrates, by way of example, a graph of input power versus SNDR for the ADC of embodiments. The current-integrating TVC 112 sampler and VTC 102 allow the design to provide 3 dB gain tuning, as shown in FIG. 20. The design of embodiments provides 6-bit tuning resolution across this 3 dB range, translating to fine gain adjustment that can help optimize system level performance.

The sampling technique of embodiments provides a unique flexibility in gain tuning while facilitating a low-power assist technique to relax sub-ADC speed requirements, which improves energy efficiency. Embodiments provide a time-based interleaved sampling architecture that uses a VTC to translate the sampled input voltage into a difference between digital timing edges followed by a digital de-multiplexer and current-integrating TVCs to sample the input onto SAR sub-ADCs. The integrators may provide gain control and/or amplify the input signal. Embodiments can use a TDC to assist the SAR sub-ADC operation by generating a coarse approximation of the input signal. Because the input is in the time domain, the TVC input can be delayed to account for a longer TDC duration, facilitating more efficient assist TDC architectures. Embodiments provide a hybrid TDC and TVC design, in which the delay line of the TVC is shared with the delay line of a flash TDC to save power. Embodiments provide an architecture that reduces the SAR ADC operating frequency relative to the TDC for power savings but uses the SAR ADC measurements to drive TDC calibration.

Figure 21:
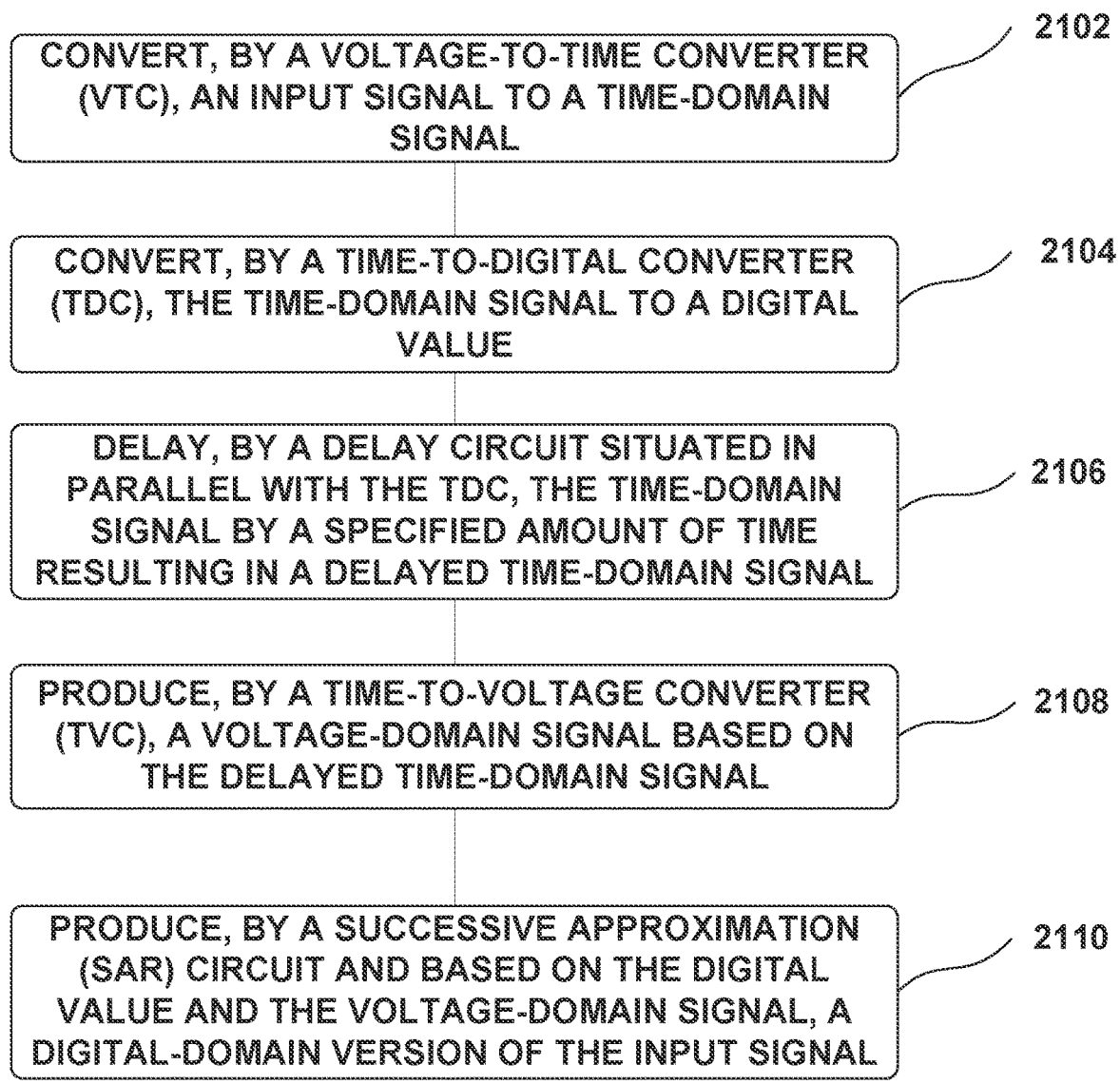
FIG. 21 illustrates, by way of example, a diagram of an embodiment of a method for improved ADC operation.

FIG. 21 illustrates, by way of example, a diagram of an embodiment of a method 2100 for signal conversion. The method 2100 as illustrated includes converting, by a voltage-to-time converter (VTC), an input signal to a time-domain signal, at operation 2102; converting, by a time-to-digital converter (TDC), the time-domain signal to a digital value, at operation 2104; delaying, by a delay circuit situated in parallel with the TDC, the time-domain signal by a specified amount of time resulting in a delayed time-domain signal, at operation 2106; producing, by a time-to-voltage converter (TVC), a voltage-domain signal based on the delayed time-domain signal, at operation 2108; and producing, by a successive approximation (SAR) circuit and based on the digital value and the voltage-domain signal, a digital-domain version of the input signal, at operation 2110.

The method 2100 can further include providing, by a digital de-multiplexer, an enable signal to each of plurality of sub-ADCs each situated to receive bits from a TDC, each of the plurality of sub-ADCs further includes an instance of a delay circuit, TVC and SAR. The method 2100 further comprising, wherein the SAR circuit includes an LSB capacitor bank and an MSB capacitor bank and the method further comprises subtracting, by the SAR circuit, the digital value of the TDC output from a TVC output using the MSB capacitor bank resulting in a difference signal. The method 2100 can further include, wherein the ADC operates using M bits and the digital-domain version of the input signal is <M bits.

The method 2100 can further include adjusting, by calibration circuitry, a gain of the TVC based on the digital difference. The method 2100 can further include, wherein the delay circuit is shared by both the TVC and the TDC. The method 2100 can further include delaying, by a programmable delay line, the time-domain signal resulting in a delayed voltage-domain signal at the TVC output. The method 2100 can further include receiving X differential inputs at a comparator bank of the TDC; and producing, by a binary encoder of the TDC, $\log_2(X)$ bits representing a time difference of the differential inputs.

Figure 22:
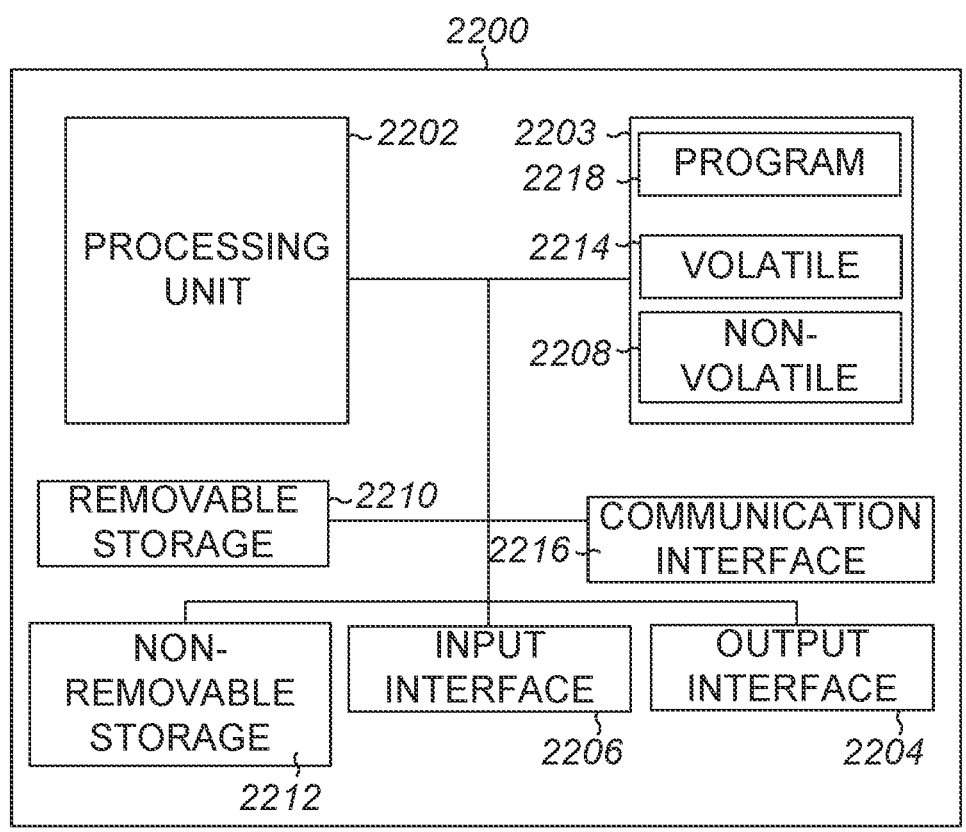
FIG. 22 illustrates, by way of example, a block diagram of an embodiment of a machine (e.g., a computer system) to implement one or more embodiments of controller logic.

FIG. 22 illustrates, by way of example, a block diagram of an embodiment of a machine 2200 (e.g., a computer system) in which the ADC, frequency stabilizer, or other device discussed herein can be used. One example machine 2200 (in the form of a computer), may include a processing unit 2202, memory 2203, removable storage 2210, and non-removable storage 2212. Although the example computing device is illustrated and described as machine 2200, the computing device may be in different forms in different embodiments. Further, although the various data storage elements are illustrated as part of the machine 2200, the storage may also or alternatively include cloud-based storage accessible via a network, such as the Internet.

Memory 2203 may include volatile memory 2214 and non-volatile memory 2208. The machine 2200 may include—or have access to a computing environment that includes a variety of computer-readable media, such as volatile memory 2214 and non-volatile memory 2208, removable storage 2210 and non-removable storage 2212. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices capable of storing computer-readable instructions for execution to perform functions described herein.

The machine 2200 may include or have access to a computing environment that includes input 2206, output 2204, and a communication connection 2216. Output 2204 may include a display device, such as a touchscreen, that also may serve as an input device. The input 2206 may include one or more of a touchscreen, touchpad, mouse, keyboard, camera, one or more device-specific buttons, one or more sensors integrated within or coupled via wired or wireless data connections to the machine 2200, and other input devices. The computer may operate in a networked environment using a communication connection to connect to one or more remote computers, such as database servers, including cloud-based servers and storage. The remote computer may include a personal computer (PC), server, router, network PC, a peer device or other common network node, or the like. The communication connection may include a Local Area Network (LAN), a Wide Area Network (WAN), cellular, Institute of Electrical and Electronics Engineers (IEEE) 802.11 (Wi-Fi), Bluetooth, or other networks.

Computer-readable instructions stored on a computer-readable storage device are executable by the processing unit 2202 (sometimes called processing circuitry) of the machine 2200. A hard drive, CD-ROM, and RAM are some examples of articles including a non-transitory computer-readable medium such as a storage device. For example, a computer program 2218 may be used to cause processing unit 2202 to perform one or more methods or algorithms described herein.

Note that the term "circuitry" as used herein refers to, is part of, or includes hardware components, such as transistors, resistors, capacitors, diodes, inductors, amplifiers, oscillators, switches, multiplexers, logic gates (e.g., AND, OR, XOR), power supplies, memories, or the like, such as can be configured in an electronic circuit, a logic circuit, a processor (shared, dedicated, or group) and/or memory (shared, dedicated, or group), an Application Specific Integrated Circuit (ASIC), a field-programmable device (FPD) (e.g., a field-programmable gate array (FPGA), a programmable logic device (PLD), a complex PLD (CPLD), a high-capacity PLD (HCPLD), a structured ASIC, or a programmable SoC), digital signal processors (DSPs), etc., that are configured to provide the described functionality In some embodiments, the circuitry may execute one or more software or firmware programs to provide at least some of the described functionality. The term "circuitry" may also refer to a combination of one or more hardware elements (or a combination of circuits used in an electrical or electronic system) with the program code used to carry out the functionality of that program code. In these embodiments, the combination of hardware elements and program code may be referred to as a particular type of circuitry.

The term "processor circuitry" or "processor" as used herein thus refers to, is part of, or includes circuitry capable of sequentially and automatically carrying out a sequence of arithmetic or logical operations, or recording, storing, and/or transferring digital data. The term "processor circuitry" or "processor" may refer to one or more application processors, one or more baseband processors, a physical central processing unit (CPU), a single- or multi-core processor, and/or any other device capable of executing or otherwise operating computer-executable instructions, such as program code, software modules, and/or functional processes.

ADDITIONAL NOTES AND EXAMPLES

Example 1 includes a converter comprising a time-to-digital converter (TDC) situated to convert a time-domain signal to a digital value, a delay circuit situated in parallel with the TDC and to delay the time-domain signal by a specified amount of time resulting in a delayed time-domain signal, a time-to-voltage converter (TNT) situated to produce a voltage-domain signal based on the delayed time-domain signal, and a successive approximation (SAR) circuit situated to receive the digital value and the voltage-domain signal and produce a digital-domain version of the input signal.

In Example 2, Example 1 further includes a voltage-to-time converter (VTC) situated to convert an input signal to the time-domain signal.

In Example 3, at least one of Examples 1-2 further includes a digital de-multiplexer situated to provide an enable signal to each of plurality of sub-ADCs each situated to receive bits from a TDC, each of the plurality of sub-ADCs including a delay circuit, TVC and SAR.

In Example 4, at least one of Examples 1-3 further includes, wherein the SAR includes an LSB capacitor bank and an MSB capacitor bank and is situated to subtract the digital value from an MSB output of the MSB capacitor bank resulting in a difference signal.

In Example 5, Example 4 further includes, wherein the ADC operates using M bits and the digital-domain version of the input signal is a value less than M.

In Example 6, Example 5 further includes calibration circuitry situated to adjust a gain of the TVC based on the digital difference.

In Example 7, at least one of Examples 1-6 further includes, wherein the delay circuit is shared by both the TVC and the TDC.

In Example 8, Example 7 further includes a programmable delay line situated to delay the time-domain signal in the TVC resulting in a shifted voltage-domain signal.

In Example 9, Example 8 further includes, wherein the TDC includes a comparator bank situated to receive X differential inputs producing X-1 thermometer bits and a binary encoder situated to produce $\log_2(X)$ bits representing the delay of the differential inputs.

Example 10 includes a circuit-based method for analog-to-digital conversion (ADC) comprising converting, by a voltage-to-time converter (VTC), an input signal to a time-domain signal, converting, by a time-to-digital converter (TDC), the time-domain signal to a digital value, delaying, by a delay circuit situated in parallel with the TDC, the time-domain signal by a specified amount of time resulting in a delayed time-domain signal, producing, by a time-to-voltage converter (TVC), a voltage-domain signal based on the delayed time-domain signal, and producing, by a successive approximation (SAR) circuit and based on the digital value and the voltage-domain signal, a digital-domain version of the input signal.

In Example 11, Example 10 further includes providing, by a digital de-multiplexer, an enable signal to each of plurality of sub-ADCs each situated to receive bits from a TDC, each of the plurality of sub-ADCs includes a delay circuit, TVC and SAR.

In Example 12, at least one of Examples 10-11 further includes, wherein the SAR circuit includes an LSB capacitor bank and an MSB capacitor bank and the method further comprises subtracting, by the SAR circuit, the digital value from an MSB output of the MSB capacitor bank resulting in a difference signal.

In Example 13, Example 12 further includes, wherein the ADC operates using M bits and the digital-domain version of the input signal is a value less than M.

In Example 14, Example 13 further includes adjusting, by calibration circuitry, a gain of the TVC based on the digital difference.

In Example 15, at least one of Examples 10-14 further includes, wherein the delay circuit is shared by both the TVC and the TDC.

In Example 16, Example 15 further includes delaying, by a programmable delay line, the voltage-domain signal resulting in a delayed voltage-domain signal.

In Example 17, Example 16 further includes receiving X differential inputs at a comparator bank of the TDC, producing X-1 thermometer bits by the comparator bank, and producing, by a binary encoder of the TDC, $\log_2(X)$ bits representing the delay of the differential inputs.

Example 18 includes a device comprising a voltage-to-time converter (VTC) situated to convert an input signal to a time-domain signal, and sub-analog-to-digital converters (sub-ADCs), each of the sub-ADCs comprising, a time-to-digital converter (TDC) situated to convert the time-domain signal to a digital value, a delay circuit situated in parallel with the TDC and to delay the time-domain signal by a specified amount of time resulting in a delayed time-domain signal, a time-to-voltage converter (TVC) situated to produce a voltage-domain signal based on the delayed time-domain signal, and a successive approximation (SAR) circuit situated to receive the digital value and the voltage-domain signal and produce a digital-domain version of the input signal.

In Example 19, Example 18 further includes a digital de-multiplexer situated to provide a respective enable signal to each of the sub-ADCs.

In Example 20, at least one of Examples 18-19 further includes, wherein the SAR includes an LSB capacitor bank and an MSB capacitor bank and is situated to subtract the digital value from an MSB output of the MSB capacitor bank resulting in a difference signal.

Although an embodiment has been described with reference to specific example embodiments, it will be evident that various modifications and changes may be made to these embodiments without departing from the broader scope of the present disclosure. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

The subject matter may be referred to herein, individually and/or collectively, by the term "embodiment" merely for convenience and without intending to voluntarily limit the scope of this application to any single inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, UE, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit, the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A converter comprising:
   a time-to-digital converter (TDC) situated to convert a time-domain signal to a digital value;
   a delay circuit situated in parallel with the TDC and to delay the time-domain signal by a specified amount of time resulting in a delayed time-domain signal;
   a time-to-voltage converter (TVC) situated to produce a voltage-domain signal based on the delayed time-domain signal; and
   a successive approximation (SAR) circuit situated to receive the digital value and the voltage-domain signal and produce a digital-domain version of the input signal.

2. The converter of claim 1, further comprising a voltage-to-time converter (VTC) situated to convert an input signal to the time-domain signal.

3. The converter of claim 1, further comprising a digital de-multiplexer situated to provide an enable signal to each of plurality of sub-ADCs each situated to receive bits from a TDC, each of the plurality of sub-ADCs including a delay circuit, TVC and SAR.

4. The converter of claim 1, wherein the SAR includes an LSB capacitor bank and an MSB capacitor bank and is situated to subtract the digital value from the voltage-domain signal using the MSB capacitor bank resulting in a difference signal.

5. The converter of claim 4, wherein the ADC operates using M bits and the digital-domain version of the input signal is a value less than M.

6. The converter of claim 5, further comprising calibration circuitry situated to adjust a gain of the TVC based on the digital difference.

7. The converter of claim 1, wherein the delay circuit is shared by both the TVC and the TDC.

8. The converter of claim 7, further comprising a programmable delay line situated to delay the time-domain signal in the TVC resulting in a shifted voltage-domain signal.

9. The converter of claim 8, wherein the TDC includes a comparator bank situated to receive X differential inputs producing X-1 thermometer bits and a binary encoder situated to produce $\log_2(X)$ bits representing the delay of the differential inputs.

10. A circuit-based method for analog-to-digital conversion (ADC) comprising:
    converting, by a voltage-to-time converter (VTC), an input signal to a time-domain signal;

converting, by a time-to-digital converter (TDC), the time-domain signal to a digital value;

delaying, by a delay circuit situated in parallel with the TDC, the time-domain signal by a specified amount of time resulting in a delayed time-domain signal;

producing, by a time-to-voltage converter (TVC), a voltage-domain signal based on the delayed time-domain signal; and producing, by a successive approximation (SAR) circuit and based on the digital value and the voltage-domain signal, a digital-domain version of the input signal.

11. The method of claim 10, further comprising:

providing, by a digital de-multiplexer, an enable signal to each of plurality of sub-ADCs each situated to receive bits from a TDC, each of the plurality of sub-ADCs includes a delay circuit, TVC and SAR.

12. The method of claim 10, wherein the SAR circuit includes an LSB capacitor bank and an MSB capacitor bank and the method further comprises subtracting, by the SAR circuit; the digital value from the voltage-domain signal using the MSB capacitor bank resulting in a difference signal.

13. The method of claim 12, wherein the ADC operates using M bits and the digital-domain version of the input signal is a value less than M.

14. The method of claim 13, further comprising adjusting, by calibration circuitry, a gain of the TVC based on the digital difference.

15. The method of claim 10, wherein the delay circuit is shared by both the TVC and the TDC.

16. The method of claim 15, further comprising delaying, by a programmable delay line; the voltage-domain signal resulting in a delayed voltage-domain signal.

17. The method of claim 16, further comprising:

receiving X differential inputs at a comparator bank of the TDC;

producing X-1 thermometer bits by the comparator bank; and producing, by a binary encoder of the TDC, $\log_2(X)$ bits representing the delay of the differential inputs.

18. A device comprising:

a voltage-to-time converter (VTC) situated to convert an input signal to a time-domain signal; and sub-analog-to-digital converters (sub-ADCs), each of the sub-ADCs comprising:
  a time-to-digital converter (TDC) situated to convert the time-domain signal to a digital value;
  a delay circuit situated in parallel with the TDC and to delay the time-domain signal by a specified amount of time resulting in a delayed time-domain signal;
  a time-to-voltage converter (TVC) situated to produce a voltage-domain signal based on the delayed time-domain signal; and
  a successive approximation (SAR) circuit situated to receive the digital value and the voltage-domain signal and produce a digital-domain version of the input signal.

19. The device of claim 18, further comprising a digital de-multiplexer situated to provide a respective enable signal to each of the sub-ADCs.

20. The device of claim 18, wherein the SAR includes an LSB capacitor bank and an MSB capacitor bank and is situated to subtract the digital value from the voltage-domain signal using the MSB capacitor bank resulting in a difference signal.

* * * * *